US012791917B2

(12) United States Patent
Park

(10) Patent No.: US 12,791,917 B2
(45) Date of Patent: Nov. 10, 2026

(54) CAMERA MODULE

(71) Applicant: LG INNOTEK CO., LTD., Seoul (KR)

(72) Inventor: JeKyung Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 44 days.

(21) Appl. No.: 18/789,233

(22) Filed: Jul. 30, 2024

(65) Prior Publication Data

US 2024/0388782 A1 Nov. 21, 2024

Related U.S. Application Data

(63) Continuation of application No. 18/329,867, filed on Jun. 6, 2023, now Pat. No. 12,081,851, which is a (Continued)

(30) Foreign Application Priority Data

Jan. 12, 2016 (KR) ........................ 10-2016-0003711

(51) Int. Cl.

| | |
|---|---|
| ***G03B 17/02*** | (2021.01) |
| ***H04N 23/51*** | (2023.01) |
| ***H04N 23/54*** | (2023.01) |
| ***H04N 23/55*** | (2023.01) |
| ***H05K 1/14*** | (2006.01) |

(52) U.S. Cl.

CPC ............. *G03B 17/02* (2013.01); *H04N 23/51* (2023.01); *H04N 23/54* (2023.01); *H04N 23/55* (2023.01); *H05K 1/147* (2013.01); *G03B 2217/002* (2013.01); *H05K 2201/10121* (2013.01);

(Continued)

(58) Field of Classification Search

None

See application file for complete search history.

(56) References Cited

U.S. PATENT DOCUMENTS 9,554,022 B2 1/2017 Yang
11,711,599 B2 * 7/2023 Park ........................ H04N 23/55 348/374

(Continued)

FOREIGN PATENT DOCUMENTS

CN 101324738 A 12/2008
CN 102375295 A 3/2012

(Continued)

OTHER PUBLICATIONS

International Search Report in International Application No. PCT/KR2017/000240, filed Jan. 9, 2017.

(Continued)

*Primary Examiner* — James M Hannett

(74) *Attorney, Agent, or Firm* — SALIWANCHIK, LLOYD & EISENSCHENK

(57) ABSTRACT

A camera module comprising: a housing; a lens assembly that is fixed to the housing and comprises at least one lens; a circuit board that is arranged inside the housing and comprises a first circuit board and a second circuit board, on which image sensors arranged to face the lens are mounted, respectively; and a first shield can arranged inside the housing so as to support edges of the first and second circuit boards.

19 Claims, 5 Drawing Sheets

Related U.S. Application Data continuation of application No. 17/810,505, filed on Jul. 1, 2022, now Pat. No. 11,711,599, which is a continuation of application No. 17/354,312, filed on Jun. 22, 2021, now Pat. No. 11,412,115, which is a continuation of application No. 16/861,836, filed on Apr. 29, 2020, now Pat. No. 11,076,074, which is a continuation of application No. 16/069,765, filed as application No. PCT/KR2017/000240 on Jan. 9, 2017, now Pat. No. 10,681,251.

(52) U.S. Cl.
CPC .............. *H05K 2201/10151* (2013.01); *H05K 2201/10371* (2013.01)

(56) References Cited

U.S. PATENT DOCUMENTS

| | | | | |
|---|---|---|---|---|
| 12,081,851 | B2 * | 9/2024 | Park | H04N 23/51 |
| 2006/0171704 | A1 | 8/2006 | Bingle et al. | |
| 2008/0252774 | A1 | 10/2008 | Chen et al. | |
| 2009/0021635 | A1 | 1/2009 | Cheng | |
| 2010/0103617 | A1 | 4/2010 | Soma | |
| 2011/0298925 | A1 * | 12/2011 | Inoue | H04N 23/52 348/148 |
| 2013/0027607 | A1 | 1/2013 | Jeon et al. | |
| 2013/0242099 | A1 | 9/2013 | Sauer et al. | |
| 2014/0320657 | A1 | 10/2014 | Han et al. | |

FOREIGN PATENT DOCUMENTS

| | | | |
|---|---|---|---|
| CN | 103930309 | A | 7/2014 |
| CN | 104349656 | A | 2/2015 |
| JP | 2008-035215 | A | 2/2008 |
| JP | 2010-175575 | A | 8/2010 |
| JP | 2011-188337 | A | 9/2011 |
| JP | 2014-11565 | A | 1/2014 |
| KR | 1998-010919 | U | 5/1998 |
| KR | 20-0346991 | Y1 | 4/2004 |
| KR | 10-0851684 | B1 | 8/2008 |
| KR | 10-2010-0115161 | A | 10/2010 |
| KR | 10-2013-0050767 | A | 5/2013 |
| KR | 10-2013-0105069 | A | 9/2013 |
| KR | 10-2014-0059181 | A | 5/2014 |
| KR | 10-2015-0028458 | A | 3/2015 |

OTHER PUBLICATIONS

Office Action dated Sep. 23, 2019 in U.S. Appl. No. 16/069,765.
Notice of Allowance dated Feb. 3, 2020 in U.S. Appl. No. 16/069,765.
Office Action dated Jun. 3, 2020 in Chinese Application No. 201780006569.0.
Office Action dated Dec. 15, 2020 in U.S. Appl. No. 16/861,836.
Notice of Allowance dated Mar. 22, 2021 in U.S. Appl. No. 16/861,836.
Office Action dated May 3, 2022 in Korean Application No. 10-2016-0003711.
Office Action dated Oct. 18, 2021 in U.S. Appl. No. 17/354,312.
Notice of Allowance dated Apr. 1, 2022 in U.S. Appl. No. 17/354,312.
Corrected Notice of Allowance dated Jul. 7, 2022 in U.S. Appl. No. 17/354,312.
Office Action dated Apr. 1, 2023 in Chinese Application No. 202210192413.9.
Office Action dated May 7, 2023 in Chinese Application No. 202210192406.9.
Office Action dated Oct. 31, 2022 in U.S. Appl. No. 17/810,505.
Notice of Allowance dated Mar. 6, 2023 in U.S. Appl. No. 17/810,505.
Office Action dated Oct. 12, 2023 in Chinese Application No. 202210192413.9.
Office Action dated Dec. 14, 2023 in U.S. Appl. No. 18/329,867.
Notice of Allowance dated Apr. 30, 2024 in U.S. Appl. No. 18/329,867.
Office Action dated Aug. 24, 2026 in Chinese Application No. 202410177235.1.

* cited by examiner

CAMERA MODULE

CROSS-REFERENCE TO RELATED APPLICATIONS

This application is a continuation of U.S. application Ser. No. 18/329,867, filed Jun. 6, 2023; which is a continuation of U.S. application Ser. No. 17/810,505, filed Jul. 1, 2022, now U.S. Pat. No. 11,711,599, issued Jul. 25, 2023; which is a continuation of U.S. application Ser. No. 17/354,312, filed Jun. 22, 2021, now U.S. Pat. No. 11,412,115, issued Aug. 9, 2022; which is a continuation of U.S. application Ser. No. 16/861,836, filed Apr. 29, 2020, now U.S. Pat. No. 11,076,074, issued Jul. 27, 2021; is a continuation of U.S. application Ser. No. 16/069,765, filed Jul. 12, 2018, now U.S. Pat. No. 10,681,251, issued Jun. 9, 2020; which is the U.S. national stage application of International Patent Application No. PCT/KR2017/000240, filed Jan. 9, 2017, which claims priority to Korean Application No. 10-2016-0003711, filed Jan. 12, 2016, the disclosures of each of which are incorporated herein by reference in their entirety.

TECHNICAL FIELD

The teachings in accordance with exemplary and non-limiting embodiments of this invention relate generally to a camera module, and more particularly to a camera module configured to reduce the number of parts and to simplify the assembly process in response to the reduced number of parts.

BACKGROUND ART

In general, camera modules generating an image by photographing a subject have been widely used in various fields. For example, the camera modules are widely used for smart phones, tablet PCs and CCTVs, and the camera modules are widely used by being mounted on a front side or a rear side of a vehicle to photograph a travel image and a parking image of a vehicle.

The camera modules mounted on a front side or a rear side of a vehicle are manufactured with a very small size, where the vehicular camera module may include a housing, a lens assembly mounted on the housing, an image sensor disposed at an inside of the housing and a circuit board.

In general, when a vehicular camera module is manufactured with a very small size, a circuit board contained in the vehicular camera module may be formed in a plural number, and the plurality of circuit boards may be stacked in a mutually parallel manner inside the housing.

Furthermore, in order to inhibit the circuit boards disposed in a layered manner inside the housing from moving inside the housing, the circuit boards may be mutually coupled by a plurality of screws. However, when the circuit boards are mutually coupled by using screw-connection, many numbers of circuit boards are disadvantageously required because of reduced use area of circuit boards due to screw-connection, whereby the number of parts caused by screw-connection is greatly increased and the number of assembly processes is greatly increased in order to implement the screw-connection.

DETAILED DESCRIPTION OF THE INVENTION

Technical Subject

The present invention provides a camera module configured to improve a use area of circuit board by supporting circuit boards disposed in a layered manner inside a housing without recourse to use of coupling screws, and to reduce the number of assembly processes by reducing the number of parts without recourse to use of coupling screws.

Technical Solution

In one general aspect of the present invention, there is provided a camera module comprising:

- a housing;
- a lens assembly that is fixed to the housing and comprises at least one lens;
- a circuit board that is arranged inside the housing and comprises a first circuit board and a second circuit board, on which image sensors arranged to face the lens are mounted, respectively; and
- a first shield can arranged inside the housing so as to support edges of the first and second circuit boards.

Preferably, but not necessarily, the first circuit board may be mounted with the image sensor, and the first and second circuit boards may be electrically connected by a first flexible circuit board.

Preferably, but not necessarily, the housing may include a front housing including a floor plate formed with a through hole exposing the lens and a circuit board fixing part fixing the first circuit board by being protruded from a surrounding of the through hole in the floor plate, and a rear housing coupled to the floor plate by accommodating the first shield can.

Preferably, but not necessarily, the first shield can may include at least one circuit board support part protruded toward an inside of the first shield can in order to support the edges of the circuit board, and a circuit board disengagement prevention part protruded toward an inside of the first shield can in order to inhibit the circuit board supported to the circuit board support part from being disengaged from the first shield can.

Preferably, but not necessarily, the first shield can may be manufactured with a metal material, and edges of the circuit board may be formed with a ground part electrically grounded to the first shield can.

Preferably, but not necessarily, the camera module may further comprise: a second shield can coupled to the first shield can; and

- a third circuit board fixed to the second shield can by being electrically connected to the circuit board using a flexible circuit board.

Preferably, but not necessarily, the second shield can may be coupled with a first coupling part, and the second shield can may be coupled with a second coupling part coupled with the first coupling part.

Preferably, but not necessarily, the third circuit board may be formed with a connector.

Preferably, but not necessarily, the second shield can may include a circuit board support part protruded toward an inside of the second shield can in order to support the third circuit board, and a circuit board disengagement prevention part protruded toward an inside of the second shield can in order to inhibit the third circuit board from being disengaged.

Advantageous Effects

The camera module according to the present invention has an advantageous effect in that reduction of use area of a plurality of circuit boards can be inhibited by supporting at least two circuit boards disposed in a layered manner inside a housing without recourse to using a coupling screw, an increase in the number of parts caused by using the coupling screw can be inhibited, and an increase in the number of assembly processes due to use of coupling screw can be inhibited.

BEST MODE

The invention described hereunder may be applied with various changes and several exemplary embodiments, and particular exemplary embodiments will be described in detail through exemplary drawings and detailed descriptions.

However, it should be noted that the present invention is not limited to particular exemplary embodiments, and it will be appreciated that the present invention described is intended to embrace all such alterations, modifications, and variations that fall within the scope and novel idea of the present invention. In describing the present invention, detailed descriptions of well-known art in the art may be omitted to avoid obscuring appreciation of the invention with unnecessary details.

The terminology used herein is for the purpose of describing particular example embodiments only and is not intended to be limiting. As used herein, the singular forms may be intended to include the plural forms as well, unless the context clearly indicates otherwise.

The terms "including" or "comprising" are inclusive and therefore specify the presence of stated features, integers, steps, operations, elements, and/or components, but do not preclude the presence or addition of one or more other features, integers, steps, operations, elements, components, and/or groups thereof.

Although the terms, first, second, etc., may be used herein to distinguish various elements, these elements should not be limited by these terms. These terms may be only used to distinguish one element from another element.

Figure 1:
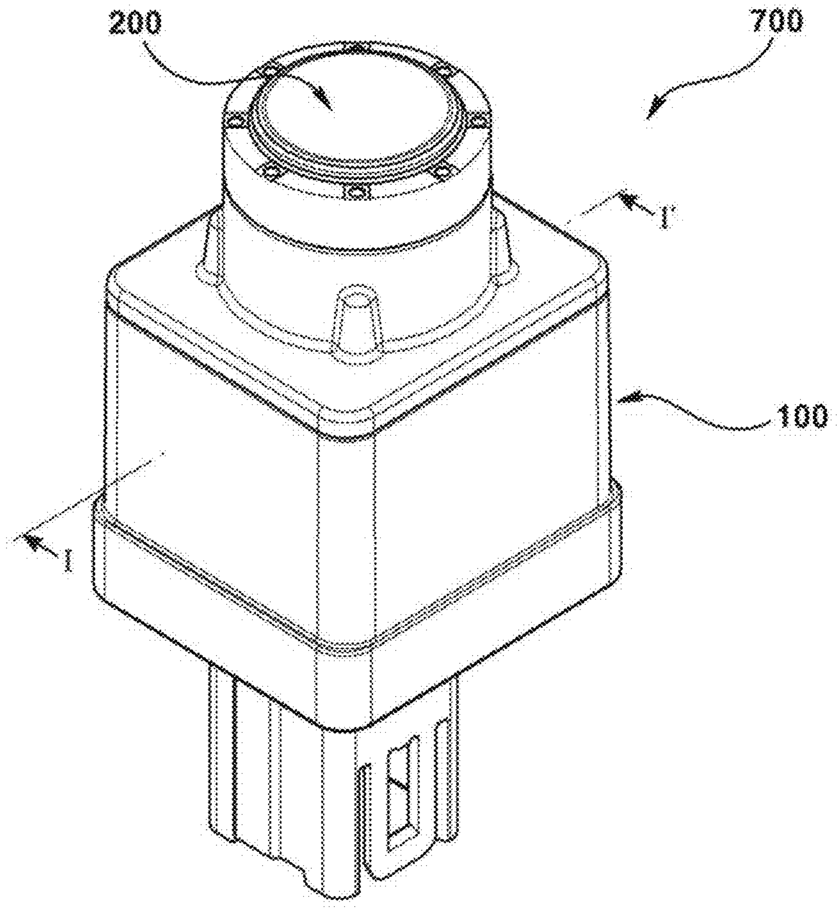
FIG. 1 is a perspective view illustrating an exterior look of a camera module according to an exemplary embodiment of the present invention.
Figure 2:
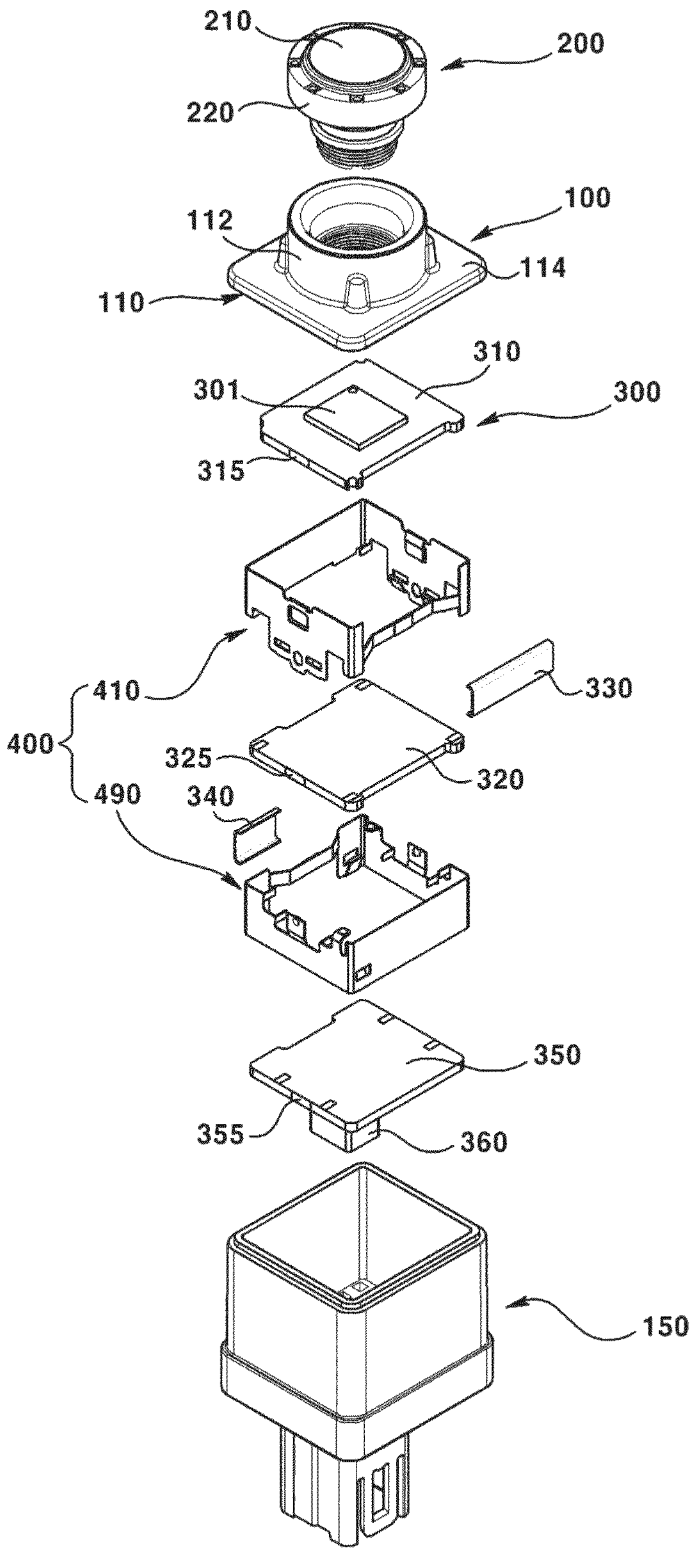
FIG. 2 is an exploded perspective view of FIG. 1.
Figure 3:
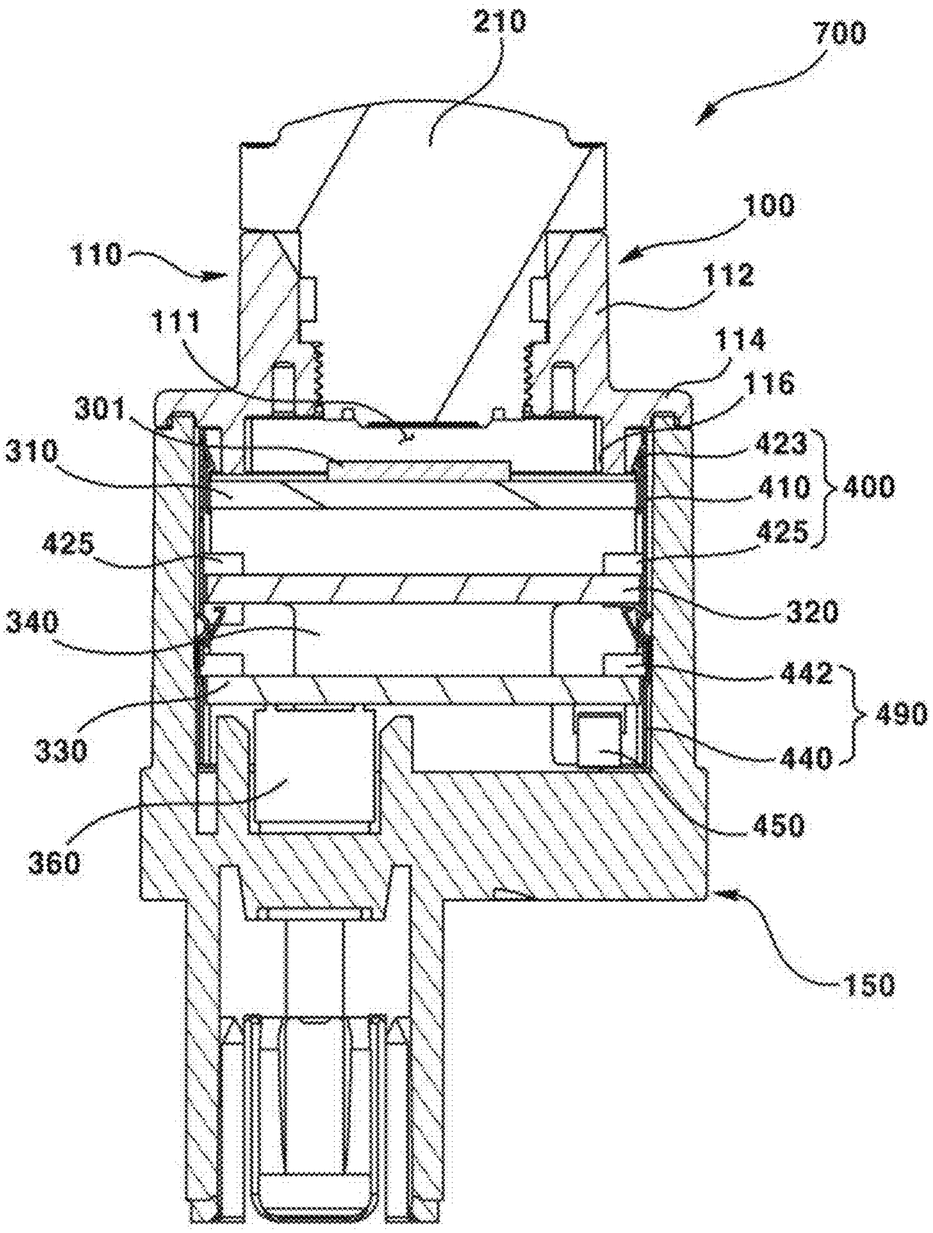
FIG. 3 is a cross-sectional view taken along line I-I' of FIG. 1.

FIG. 1 is a perspective view illustrating an exterior look of a camera module according to an exemplary embodiment of the present invention. FIG. 2 is an exploded perspective view of FIG. 1. FIG. 3 is a cross-sectional view taken along line I-I' of FIG. 1.

Referring to FIGS. 1, 2 and 3, a camera module (700) may include a housing (100), a lens assembly (200), a circuit board (300) and a first shield can (400). The housing (100) may accommodate a lens assembly (200, described later), a circuit board (300) and a first shield can (400). The housing (100) in an exemplary embodiment may include a front housing (110) and a rear housing (150) as illustrated in FIG. 2.

Figure 4:
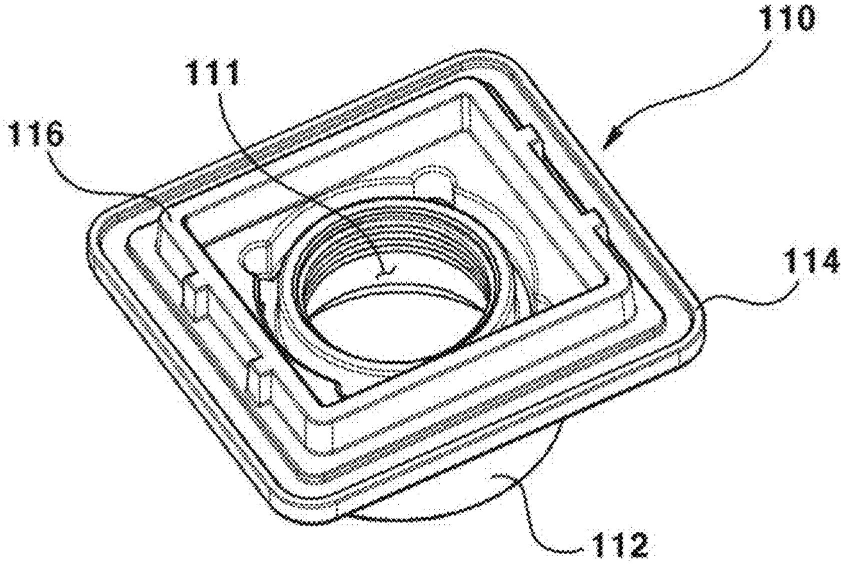
FIG. 4 is a perspective view illustrating a rear surface of a front housing of FIG. 1.

FIG. 4 is a perspective view illustrating a rear surface of a front housing of FIG. 1.

Referring to FIG. 4, the front housing (110) may include a front housing body (112), a floor plate (114) and a circuit board support part (116). The front housing body (112) may take a cylindrical shape formed with a through hole (111), for example. The front housing body (112) may be formed in a cylindrical shape formed with a through hole (111), for example, and a female screw part may be formed at an inner surface of the front housing body (112).

The floor plate (114) may be protruded from an outer surface of the front housing body (112) in a plate shape, and the floor plate (114) may be formed in a square plate, for example.

The circuit board support part (116) may be protruded at a surrounding of through hole (111) in the floor plate (114), and the circuit board support part (116) may be contacted or bonded by an adhesive to one of the circuit board (described later).

Referring to FIG. 2, the rear housing (150) may accommodate the circuit board (300) and a first shield can (400), and the rear housing (150) may be coupled to the front housing (110) by an adhesive without recourse to using a coupling screw.

In an exemplary embodiment of the present invention, a distal end of rear housing (150) facing the front housing (110) and the floor plate (114) of the front housing (110) may be mutually bonded by using an adhesive.

The lens assembly (200) may include a lens body (220) and a lens (210) formed at the lens body (220), and an outer surface of the lens body (220) at the lens assembly (200) may be formed with a male screw part coupled with the female screw part.

An adhesive may be interposed between the male screw part of lens body (220) and the female screw part of front housing body (112) at the front housing (110).

The adhesive may mutually bond the lens body (220) and the front housing body (112) and function to inhibit introduction of moisture from outside as well.

The adhesive may include an epoxy resin cured by heat, an epoxy resin cured by UV (Ultraviolet) rays or a hybrid epoxy resin cured by heat and UV rays, for example.

Referring to FIGS. 1 and 3, the circuit board (300) may be disposed at an inside of housing (100) facing the lens (210) of lens assembly (200). In an exemplary embodiment of the present invention, the circuit board (300) may include a first circuit board (310), a second circuit board (320), a first flexible circuit board (330), a second flexible circuit board (340) and a third circuit board (350).

The first circuit board (310) may be so disposed as to face the lens (210), and the first circuit board (310) may be mounted with an image sensor (301). The image sensor (301) may generate an image corresponding to an outside light inputted from the lens (210).

In an exemplary embodiment of the present invention, the first circuit board (310) may be formed in a square plate, for example.

The first circuit board (310) may be formed at a side surface with a first ground part having an electric conductivity. The second circuit board (320) may be so disposed as to face the first circuit board (310), and the second circuit board (320) may be so disposed as to be parallel with the first circuit board (310), and the second circuit board (320) may be formed at a side surface with a second ground part (325) having an electric conductivity.

In an exemplary embodiment of the present invention, the second circuit board (320) may be formed with a same size as that of the first circuit board (310), for example. The first flexible circuit board (330) may electrically connect the mutually, oppositely arranged first and second circuit boards (310,320). Each portion electrically contacted to the first flexible circuit board (330) in the first and second circuit boards (310,320) may be formed with a concave groove in order to inhibit the first flexible circuit board (330) from being protruded from side surfaces of the first and second circuit boards (310,320).

The third circuit board (350) may be so disposed as to face the second circuit board (320), and the third circuit board (350) and the second circuit board (320) may be electrically connected through the second flexible circuit board (340). The third circuit board (350) may be formed at a side surface with a third ground part (355) having an electric conductivity.

In an exemplary embodiment of the present invention, the third circuit board (350) may be formed with a same size as that of the first and second circuit boards (310, 320), for example.

The first and second circuit boards (310, 320) may be connected to the first flexible circuit board (330), and the second and third circuit boards (320,350) may be connected to the second flexible circuit board (340), whereby the first, second and third circuit boards (310, 320, 350) may be mutually electrically connected in a mutually stacked condition.

In an exemplary embodiment of the present invention, the third circuit board (350) may be mounted with a connector (360), and the connector (360) may be electrically connected to an outside connector to apply an electricity or a control signal to the first, second and third circuit boards (310, 320, 350) and the image sensor (301), or output an image data generated from the image sensor to an outside through the first, second and third circuit boards.

In an exemplary embodiment of the present invention, when the camera module (700) includes only the first and second circuit boards (310,320), the camera module (700) may include a first shield can (400), and when the camera module (700) includes all the first, second and third circuit boards (310, 320, 350), the camera module (700) may include first and second shield cans (400,490).

Hereinafter, an exemplary embodiment of the present invention explains the first shield can (400) fixing the first and second circuit boards (310,320), and explains the second shield can (490) fixing the third circuit board (350) connected to the second circuit board (320).

Figure 5:
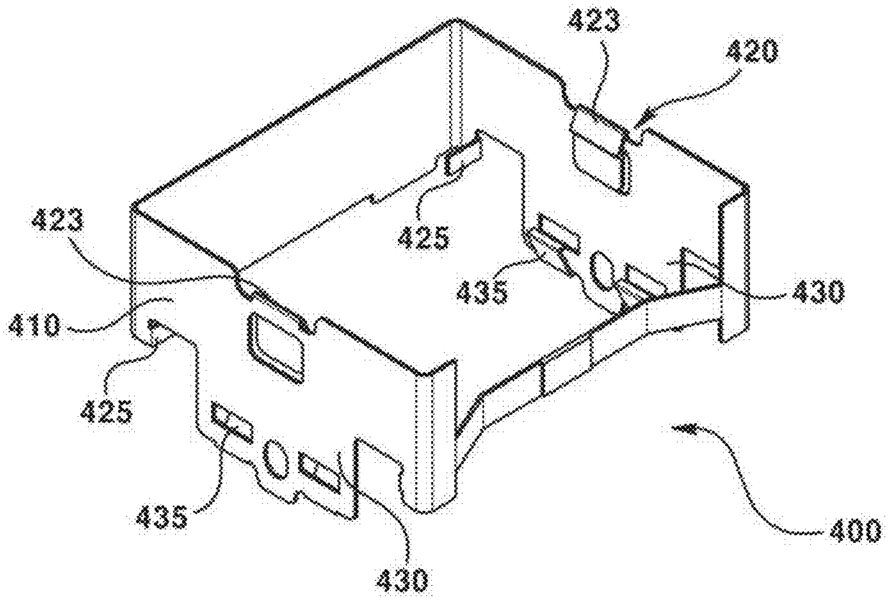
FIG. 5 is a perspective view illustrating a first shield can according to an exemplary embodiment of the present invention.

FIG. 5 is a perspective view illustrating a first shield can according to an exemplary embodiment of the present invention.

Referring to FIGS. 3 and 5, the first shield can (400) can fix the first and second circuit boards (310,320) disposed at an inside of housing (100) at a predetermined place without recourse to using a coupling screw.

In an exemplary embodiment of the present invention, the first shield can (400) may be so formed as to take a shape wrapping edges of the first and second circuit boards (310, 320). The first shield can (400) may be manufactured with a conductive material, and the first shield can (400) may be formed with a metal plate having a thin thickness by way of press processing.

For example, when the first and second circuit boards (310,320) disposed at an inside of housing (100) are respectively formed with a square plate shape, the first shield can (400) may have four (4) first side walls (410) wrapping edges of the first and second circuit boards (310,320), for example.

In order to fix the first and second circuit boards (310, 320) to the first shield can (400), a pair of first side walls (410) facing the shield can (400) may be formed with first and second circuit board support parts (423, 425). The first circuit board support part (423) may be disposed at a distal end of each first side wall (410).

The first circuit board support part (423) formed at a distal end of the first side wall (410) may be formed by cutting out a portion of the first side wall (410) and inwardly bending the cut-out first shield can (400), for example.

Although an exemplary embodiment of the present invention has illustrated and explained that the first circuit board support part (423) is formed by cutting out a portion of the first side wall (410) and inwardly bending the cut-out first shield can (400), the first circuit board support part (423) may be also formed by allowing a portion of the first side wall (410) to be caved inside of the first shield can (400) in a state of the first side wall (410) not being cut out.

In an exemplary embodiment of the present invention, the first circuit board (310) may be supported by being hitched at the first circuit board support part (423) after being inserted into the first shield can (400).

The first ground part (315) formed at a side surface of first circuit board (310) may be electrically connected to the first side wall (410) of the first shield can (400), whereby the first circuit board (310) can be grounded through the first shield can (400).

The second circuit board support part (425) may be disposed at the other side end facing one side end of the first side wall (410) of first shield can (400), and the second circuit board support part (425) formed at the other side end of the first side wall (410) may be formed by allowing a portion of the first side wall (410) to be bent inside of the first shield can (400) after cutting off the portion of the first side wall (410).

Although an exemplary embodiment of the present invention has illustrated and explained that the second circuit board support part (425) is formed by allowing a portion of the first side wall (410) to be bent inside of the first shield can (400) after cutting off the portion of the first side wall (410), the second circuit board support part (425) may be also formed by allowing a portion of the first side wall (410) to be caved inside of the first shield can (400) in a state of the first side wall (410) not being cut out.

A portion corresponding to the first flexible circuit board (330) connected to the first circuit board (310) in the first side wall (410) of the first shield can (400) may be partially cut out and formed in a bar shape in order to minimize the interference with the first flexible circuit board (330).

In an exemplary embodiment of the present invention, the second circuit board (320) may be supported by being hitched at the second circuit board support part (425) after being inserted into the first shield can (400) through an upper side of the first shield can (400).

The second ground part (325) formed at a side surface of second circuit board (320) may be electrically connected to the first side wall (410) of the first shield can (400), whereby the second circuit board (320) can be also grounded through the first shield can (400).

A pair of mutually-facing first side walls (410) in the first side walls (410) of the first shield can (400) may be formed with a first protrusion (430) protruded higher than the second circuit board (320), where the first protrusion (430) may be formed with a first circuit board disengagement prevention part (435).

Referring to FIG. 5 again, the first circuit board disengagement prevention part (435) can inhibit the second circuit board (320) from being disengaged from the first shield can (400), and the first circuit board disengagement prevention part (435) may be formed by cutting off a portion of the first protrusion (430) and allowing the cut-off portion to be inwardly bent into the first shield can (400).

The first circuit board disengagement prevention part (435) may be hitched at an upper surface of the second circuit board (320), and the first circuit board disengagement prevention part (435) may inhibit the second circuit board (320) from being moved or disengaged from the first shield can (400).

Figure 6:
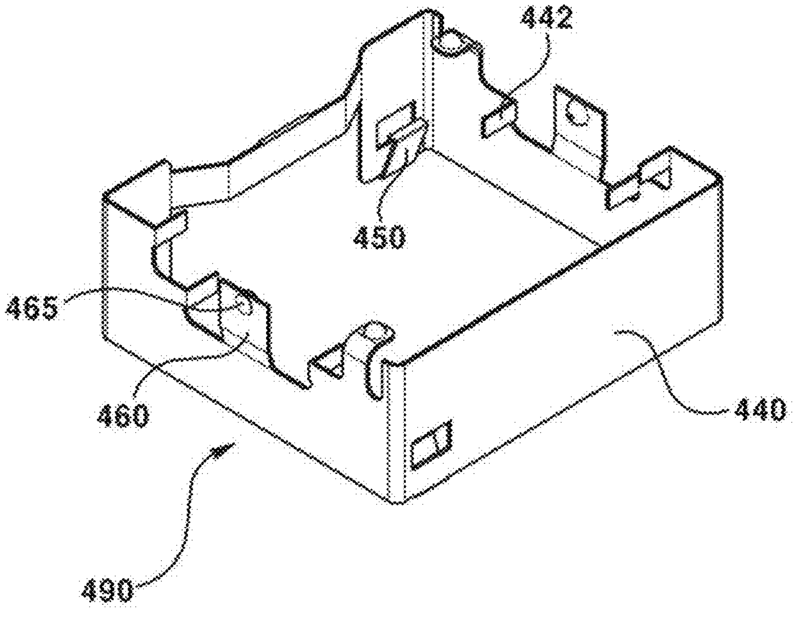
FIG. 6 is a perspective view illustrating a second shield can according to an exemplary embodiment of the present invention.

Meantime, the first protrusion (430) formed with the first circuit board disengagement prevention part (435) may be formed with a first coupling part (437), where the first coupling part (437) may be coupled to a second shield can (490) to be explained in FIG. 6.

The first coupling part (437) formed at the first protrusion (430) may be one of hitching pieces bent outward of the first shield can (400) by cutting out a hole or a portion of the first protrusion (430).

FIG. 6 is a perspective view illustrating a second shield can according to an exemplary embodiment of the present invention.

Referring to FIGS. 3 and 6, a second shield can (490) may fix a third circuit board (350) disposed at an inside of the housing (100) to a predetermined place inside the housing (100) without recourse to using a coupling screw. The second shield can (490) may be formed in a shape of wrapping edges of the third circuit board (350).

The second shield can (490) may be manufactured with a conductive material, and the second shield can (490) may be formed with a metal plate having a thin thickness by way of press processing of the metal plate.

For example, when the third circuit board (350) disposed within the housing (100) takes a square plate shape, the second shield can (490) may be formed with four (4) second side walls (440) that wrap edges of the third circuit board (350).

In order to fix the third circuit board (350) to the second shield can (490), each of the second side walls (440) of the second shield can (490) may be formed with a third circuit board support part (442). The third circuit board support part (442) may be disposed at one side of the second side wall (440) adjacent to the first shield can (400), and the third circuit board support part (442) formed at one side of the second side wall (440) may be formed by cutting out a portion of the second side wall (440) and bending the cut-out portion inwardly of the second shield can (490), for example.

A portion corresponding to the second flexible circuit board (340) connected to the third circuit board (350) in the second side walls (410) of the second shield can (490) may be partially cut out and formed in a bar shape in order to minimize the interference with the second flexible circuit board (340).

In an exemplary embodiment of the present invention, the third circuit board (350) may be supported by being hitched at the third circuit board support part (442) after being inserted into the second shield can (490).

A third ground part (355) formed at a side surface of third circuit board (350) may be electrically connected to the second side wall (440) of the second shield can (490), whereby the third circuit board (350) can be grounded through the second shield can (490).

An upper end of the second side wall of the second shield can (490) may be formed with a second circuit board disengagement prevention part (450) to inhibit the third circuit board (350) supported to the second shield can (490) from being disengaged from the second shield can (490).

The second circuit board disengagement prevention part (450) formed at the second shield can (490) may be formed by cutting off and bending a portion of the second side wall (440), where the second circuit board disengagement prevention part (450) may press the third circuit board (350) to inhibit the third circuit board (350) from being disengaged from the second shield can (490).

A pair of mutually-facing second side walls (440) in the second side walls of the second shield can (490) may be formed with a second protrusion (460) protruded toward the first protrusion (430) formed at the first side wall (410) of the first shield can (400).

The second protrusion (460) may be formed with a second coupling part (465), where the second coupling part (465) may be coupled with the first coupling part (437) formed at the first protrusion (430) of the first shield can (400).

The second coupling part (465) formed at the second protrusion (460) may be one of hitching pieces bent outward of the first shield can (400) by cutting out a hole or a portion of the second protrusion (460).

As explained in the foregoing discussion, the camera module according to the present invention is such that reduction of use area of a plurality of circuit boards can be inhibited by supporting at least two circuit boards disposed in a layered manner inside a housing without recourse to using a coupling screw, an increase in the number of parts caused by using the coupling screw can be inhibited, and an increase in the number of assembly processes due to use of coupling screw can be inhibited.

Meantime, the exemplary embodiments disclosed by the enclosed drawings are merely particular examples in order to help understand the present invention, and may not be considered as limiting the scope of the present invention. It should be apparent to the skilled in the art that other modifications based on the technical ideas of the present invention are implementable.

INDUSTRIAL APPLICABILITY

The present invention may be used for a camera module mounted on a vehicle.

The invention claimed is:

1. A camera module comprising:

a housing;

a lens assembly that is coupled to the housing and comprises at least one lens;

a first circuit board disposed inside the housing;

a second circuit board disposed below the first circuit board;

a first flexible circuit board that electrically connects the first and second circuit boards;

a first shield can disposed in the housing to support the first circuit board and the second circuit board, wherein the first shield can comprises a plurality of sidewalls, and wherein one of the plurality of sidewalls includes a reduced thickness region formed by a cut-out portion in a central area thereof to accommodate the first flexible circuit board, such that a thickness of the sidewall in the reduced thickness region in an optical axis direction is smaller than a thickness of another sidewall in the optical axis direction.

2. The camera module of claim 1, wherein the plurality of sidewalls comprises a first sidewall, and wherein the first sidewall includes a hole disposed to overlap the first circuit board or second circuit board in a direction perpendicular to the optical axis direction.

3. The camera module of claim 2, wherein the first shield can includes a first circuit board support part protruded toward an inside of the first shield can to support edges of the first circuit board, and wherein the first sidewall includes a first hole disposed on the first circuit board support part.

4. The camera module of claim 2, wherein the first shield can includes a first circuit board disengagement prevention part protruded toward an inside of the first shield can to inhibit the second circuit board from being disengaged from the first shield can, wherein the first sidewall includes a second hole disposed on the first circuit board disengagement prevention part.

5. The camera module of claim 2, wherein the first shield can includes a second circuit board support part protruded toward an inside of the first shield can to support an upper surface of the second circuit board, wherein the first sidewall includes a third hole disposed to overlap the second circuit board support part in a direction perpendicular to the optical axis direction.

6. The camera module of claim 1, comprising: a second shield can coupled to the first shield can; and a third circuit board fixed to the second shield can, wherein the second shield can comprises a second side-wall.

7. The camera module of claim 6, wherein the second shield can includes a third circuit board support part protruded toward an inside of the second shield can to support an upper surface of the third circuit board, wherein the second sidewall includes a fourth hole disposed to overlap the third circuit board support part in a direction perpendicular to the optical axis direction.

8. The camera module of claim 6, wherein the second shield can includes a second circuit board disengagement prevention part protruded toward an inside of the second shield can to inhibit the third circuit board from being disengaged the second shield can, wherein the second sidewall includes a fifth hole disposed on the second circuit board disengagement prevention part.

9. The camera module of claim 2, wherein the first circuit board is mounted with the image sensor, wherein the first sidewall comprises a first region, an entirety of which is overlapped with the first flexible circuit board in a lateral direction perpendicular to the optical axis direction.

10. The camera module of claim 9, wherein an area of the first shield can where the first flexible circuit board is disposed is formed in a bar shape partially cut away.

11. The camera module of claim 1, wherein a first ground part is formed on a side surface of the first circuit board, and the first ground part is in contact with an inner surface of the first shield can.

12. The camera module of claim 1, wherein a second ground part is formed on a side surface of the second circuit board, and the second ground part is in contact with an inner surface of the first shield can.

13. The camera module of claim 1, wherein the first circuit board and the second circuit board are formed in the same size.

14. The camera module of claim 1, wherein the first shield can is manufactured with a metal material, and edges of the first circuit board are formed with a ground part electrically grounded to the first shield can.

15. The camera module of claim 6, wherein the second and third circuit boards are electrically connected by a second flexible circuit board.

16. The camera module of claim 15, wherein an area of the second shield can where the second flexible circuit board is disposed is formed in a bar shape partially cut away.

17. The camera module of claim 6, wherein a third ground part is formed on a side surface of the third circuit board, and the third ground part is in contact with an inner surface of the second shield can.

18. The camera module of claim 9, wherein the first region is spaced apart from the first circuit board and the second circuit board.

19. The camera module of claim 9, wherein the first sidewall comprises a plurality of second regions having a height greater than a height of the first region, and wherein the first region is disposed between second regions of the plurality of second regions.

* * * * *